United States Patent
Mundt et al.

(10) Patent No.: US 9,730,364 B2
(45) Date of Patent: Aug. 8, 2017

(54) REVERSIBLE CONTRA-ROTATING FAN SYSTEM

(71) Applicant: Dell Products L.P., Round Rock, TX (US)

(72) Inventors: Kevin Warren Mundt, Austin, TX (US); Orin M. Ozias, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 654 days.

(21) Appl. No.: 14/073,094

(22) Filed: Nov. 6, 2013

(65) Prior Publication Data
US 2015/0127188 A1    May 7, 2015

(51) Int. Cl.
| | |
|---|---|
| *H05K 7/20* | (2006.01) |
| *F04D 19/02* | (2006.01) |
| *G05D 23/19* | (2006.01) |
| *F04D 19/00* | (2006.01) |

(52) U.S. Cl.
CPC ....... *H05K 7/20727* (2013.01); *F04D 19/007* (2013.01); *F04D 19/024* (2013.01)

(58) Field of Classification Search
CPC .................................................. G05D 23/1917
USPC ....................................................... 700/300
See application file for complete search history.

(56) References Cited

U.S. PATENT DOCUMENTS

| | | | | |
|---|---|---|---|---|
| 5,546,272 A | * | 8/1996 | Moss | H05K 7/2019 361/679.48 |
| 2011/0130891 A1 | * | 6/2011 | Nielsen | G06F 1/206 700/300 |

OTHER PUBLICATIONS

Louis "Axial Flow Contra-Rotating Turbines", ASME, 1985, p. 1-9.*
Hughes, "Commercial industrial and special application ceiling fans", 1999, p. 24.*

* cited by examiner

*Primary Examiner* — Sean Shechtman
(74) *Attorney, Agent, or Firm* — Haynes and Boone, LLP

(57) ABSTRACT

A contra-rotating fan system includes a fan chassis. A first fan in the fan chassis includes blades that provide airflow in a first direction when the first fan rotates in a second direction, and provide airflow in a third direction opposite the first direction when the first fan rotates in a fourth direction opposite the second direction. A second fan adjacent the first fan in the fan chassis includes the same number of blades as the first fan. The first fan and the second fan rotate at the same time in opposite directions. The blades on the second fan provide airflow in the first direction when the first fan rotates in the second direction and the second fan rotates in the fourth direction, and provides airflow in the third direction when the first fan rotates in the fourth direction and the second fan rotates in the second direction.

20 Claims, 12 Drawing Sheets

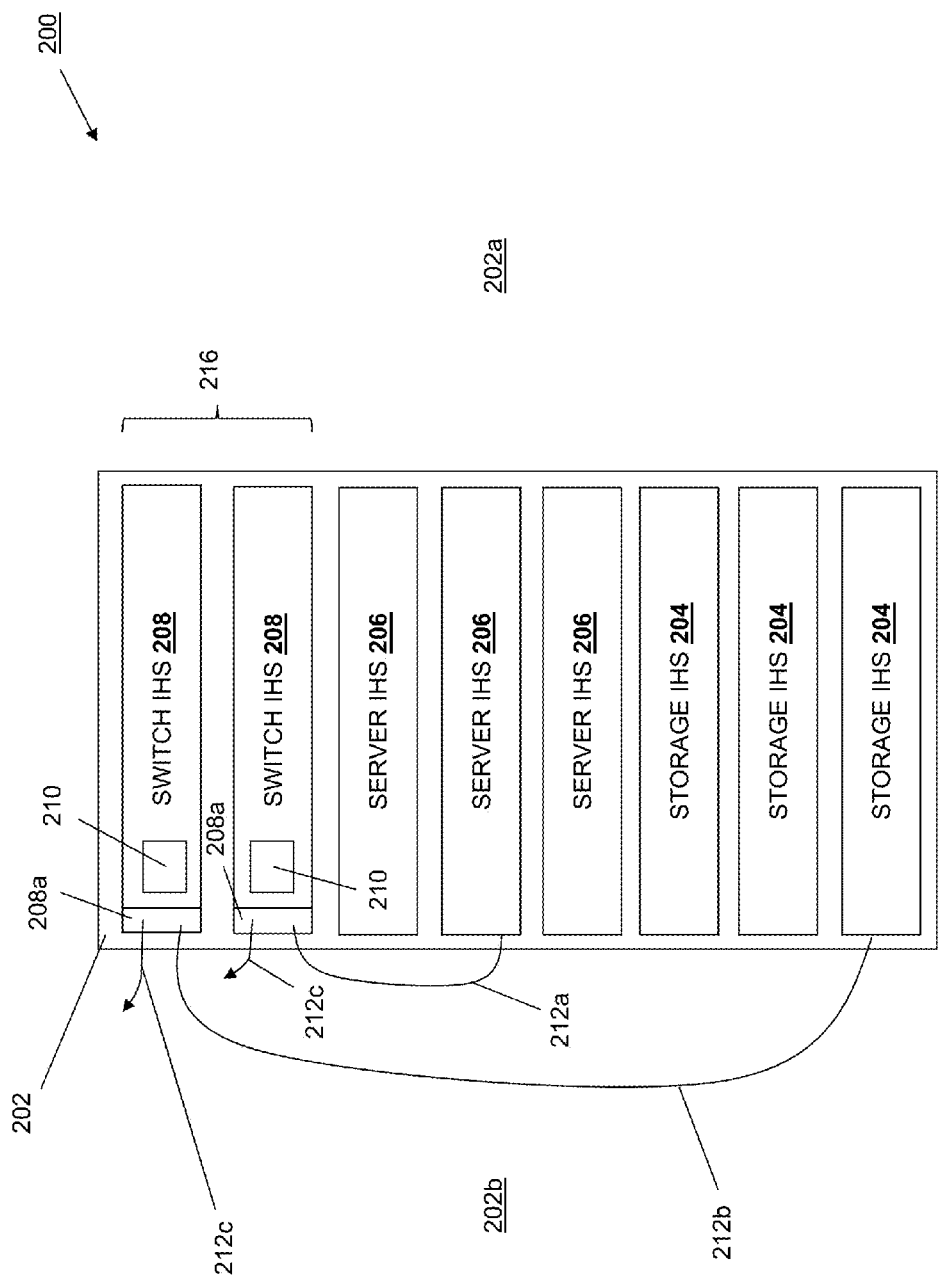

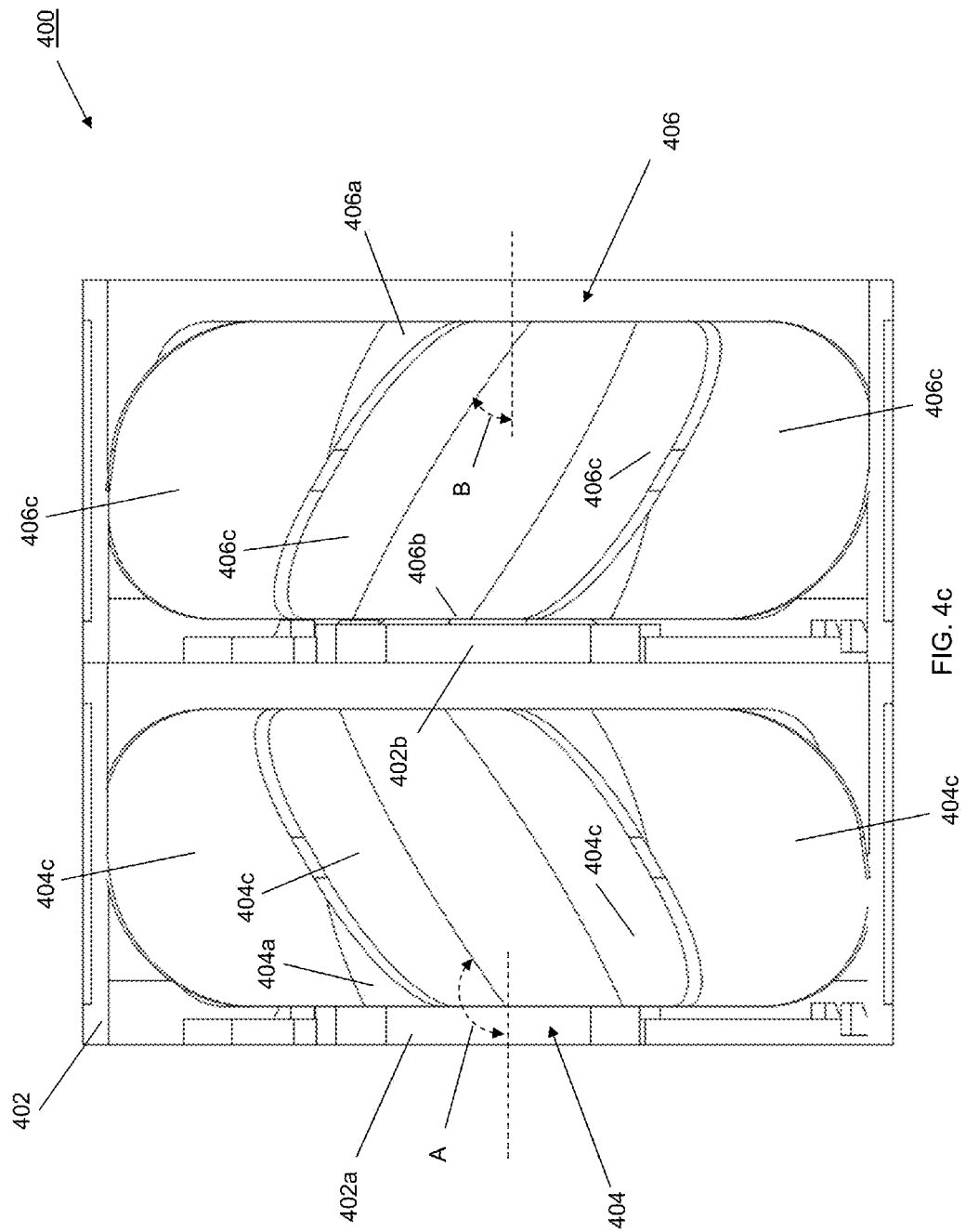

REVERSIBLE CONTRA-ROTATING FAN SYSTEM

BACKGROUND

The present disclosure relates generally to information handling systems, and more particularly to a reversible contra-rotating fan system for cooling an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs such as, for example, switch IHSs, are commonly mounted, along with server IHSs, storage IHSs, and/or a variety of other IHSs known in the art, in racks in a data center. Some data center rack configurations require that the switch IHSs be mounted such that the ports on the switch IHS face outward from a first side of the rack (e.g., a "front" side of the rack), while other data center rack configurations require that the switch IHSs be mounted such that the ports on the switch IHS face outward from a second side of the rack that is opposite the first side (e.g., a "rear" side of the rack). The possibility of mounting the switch IHSs in the rack in multiple different orientations can create cooling problems for the switch IHSs, which typically include a cooling system that is configured to move air through the switch IHS in one direction.

Generally, the front side of the rack is considered the "cool" side of the rack, while the rear side of the rack is considered the "hot" side of the rack. This is because most IHSs and other rack devices are configured to be mounted in the rack such that their cooling systems pull relatively cooler air from the front side of the rack and expel that air, now heated air, out of the rear side of the rack. Thus, if a switch IHS is mounted in the rack such that the ports on the switch IHS face outward from the rear side of the rack, the cooling system in the switch IHS may be configured to move air through the switch IHS in a direction that causes air to be drawn from the rear/hot side of the rack and expelled out to the front/cool side of the rack. The drawing of air from the rear/hot side of the rack prevents the optimal cooling of the switch IHS, and the expelling of that air out to the front/cool side of the rack may result in that heated air being drawn into the IHSs and other devices mounted to the rack, thus reducing the cooling capabilities of any IHSs or other devices mounted adjacent the switch IHS in the rack.

Conventional solutions to this problem include providing the cooling system of the switch IHS with removable fans that may be removed from the switch IHS and then reoriented and reinserted into the switch IHS based on how the switch IHS is mounted in the rack such that the direction of airflow provided by the cooling system does not result in the deficiencies discussed above. However, such solutions require that the user remove those fans from the switch IHS and reorient those fans to provide the appropriate direction of airflow, and it has been found that a very large number of switch IHSs in data centers are mounted in racks with their cooling system fans orientated to provide an incorrect airflow direction that results in the deficiencies discussed above. Other solutions include switch IHS manufacturers providing two types of each switch IHSs: a first type of switch IHS with a cooling system that provides airflow through the switch IHS in a first direction, and a second type of switch IHS with a cooling system that provides airflow through the switch IHS in a second direction that is opposite the first direction. The user must then purchase the type of switch IHS having the cooling system that provides airflow in a direction that will not cause the issues discussed above. However, while such solutions may provide for the proper airflow upon an initial deployment of the switch IHS, they limit redeployment of the switch IHS in reverse orientations, and add inventory and parts costs for the switch IHS manufacturer.

Accordingly, it would be desirable to provide an improved cooling system for an IHS.

SUMMARY

According to one embodiment, a contra-rotating fan system includes a fan chassis; a first fan that is mounted in the fan chassis and that includes a number of blades that are oriented to provide an airflow in a first direction when the first fan is rotated in a second direction, and to provide an airflow in a third direction that is opposite the first direction when the first fan is rotated in a fourth direction that is opposite the second direction; and a second fan that includes the same number of blades as the first fan and that is mounted in the fan chassis adjacent the first fan, wherein the first fan and the second fan are configured to rotate at the same time in opposite directions, and wherein the blades on the second fan are oriented to provide an airflow in the first direction when the first fan is rotated in the second direction and the second fan is rotated in the fourth direction, and to provide an airflow in the third direction when the first fan is rotated in the fourth direction and the second fan is rotated in the second direction.

BRIEF DESCRIPTION OF THE DRAWINGS

FIG. 2b is a side schematic view illustrating an embodiment of a plurality of IHSs mounted in a rack, with at least one IHS in a rear mounted orientation that is opposite the front mounted orientation of FIG. 2a.

FIG. 4b is a perspective view illustrating an embodiment of the contra-rotating fan system of FIG. 4a.

FIG. 4c is a cut-away side view illustrating an embodiment of the contra-rotating fan system of FIG. 4a.

FIG. 4d is a cut-away perspective view illustrating an embodiment of the contra-rotating fan system of FIG. 4a.

FIG. 4e is a perspective view illustrating an embodiment of contra-rotating fans in the contra-rotating fan system of FIG. 4a.

FIG. 6b is a perspective view illustrating an embodiment of contra-rotating fans in the contra-rotating fan system of FIGS. 4a-e operating according to a second rotation scheme to produce an airflow in a second direction that is opposite the first direction of FIG. 6a

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
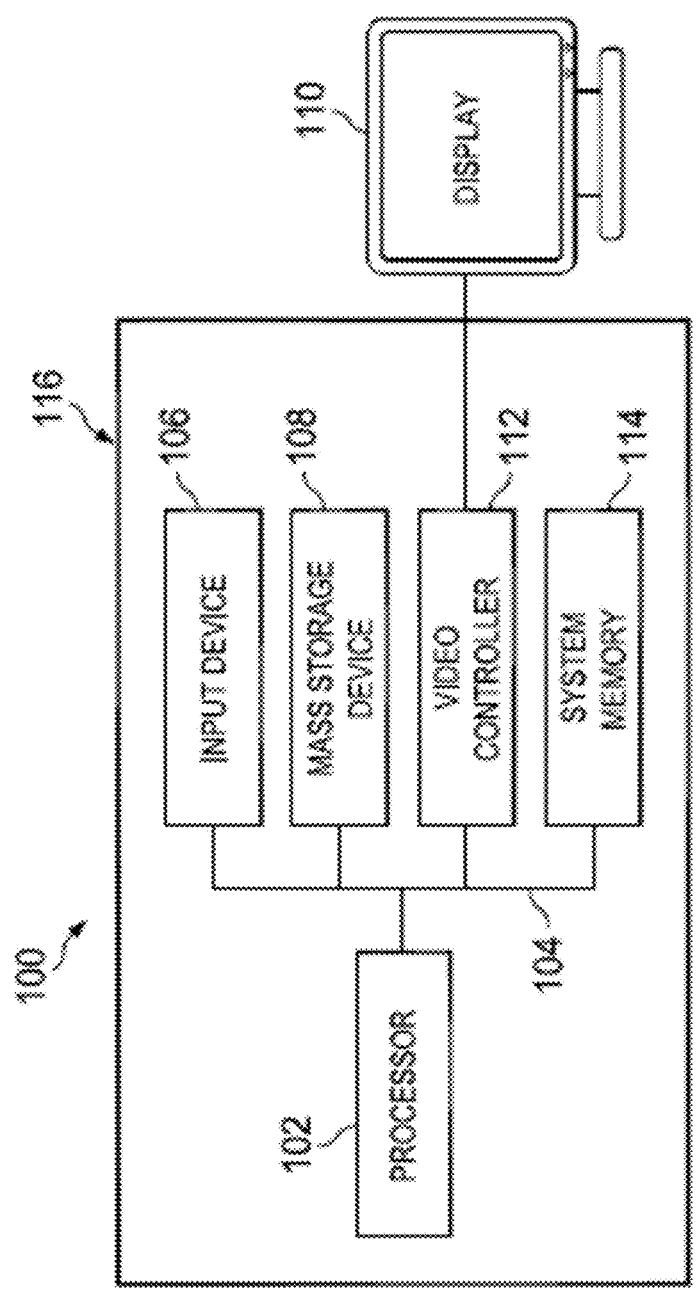
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
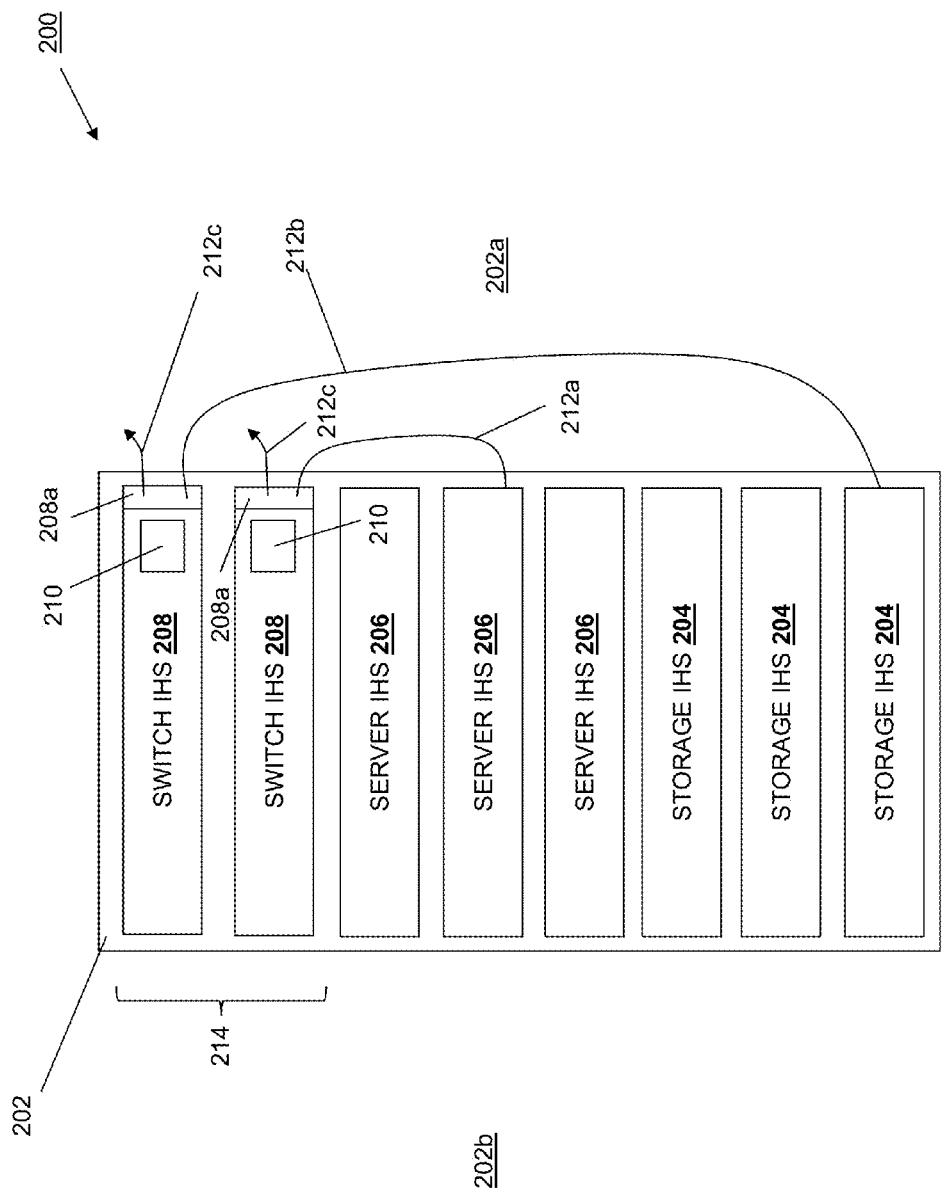
FIG. 2a is a side schematic view illustrating an embodiment of a plurality of IHSs mounted in a rack, with at least one IHS in a front mounted orientation.

Referring now to FIGS. 2a and 2b, an embodiment of a data center system 200 is illustrated that provides a plurality of IHSs, any or all of which may include a cooling system that operates according to the teachings of the present disclosure. Thus, while the specific embodiments discussed below are directed to a cooling system in a switch IHS in an IHS rack, one of skill in the art in possession of the present disclosure will recognize that a wide variety of IHSs will benefit from the cooling system of the present disclosure. Furthermore, while the specific embodiments discussed below are directed IHSs housed in an IHS rack, one of skill in the art in possession of the present disclosure will recognize that IHSs having the cooling system described herein may benefit from that cooling system even without being positioned in an IHS rack. For example, the cooling system discussed below may operate to automatically configure itself to draw air from the lowest temperature air source, and thus even a single IHS located by itself (e.g., not in an IHS rack) may benefit from that cooling system.

The data center system 200 includes an IHS rack 202 that is configured to house a plurality of IHSs. While not illustrated, the IHS rack 202 may also be configured to be coupled to blanks that may be positioned in open slots that do not include IHSs, and that operate to block airflow through slots in the IHS rack 202 when no IHS is present in that slot. The IHS rack 202 is associated with a first side 202a that may be referred to as a "front" side of the IHS rack 202, along with a second side 202b that is located opposite the IHS rack 202 from the first side 202a and that may be referred to as a "rear" side of the IHS rack 202. For example, the IHS rack 202 may be one of a plurality of IHSs racks in a data center that are positioned in a plurality of rows, and the IHS rack 202 may be positioned adjacent an aisle that is located on the first/front side 202a of the IHS rack 202 and that allows a user to move between rows of the IHS racks in the data center, while the second/rear side 202b of the IHS rack 202 may face an other second/rear side of an IHS rack in an adjacent row of IHS racks in the data center. While a specific embodiment of a data center including IHS racks has been described, one of skill in the art in possession of the present disclosure will recognize that a wide variety of IHS rack configurations and orientations will benefit from the teachings of the present disclosure, and any number of IHS racks (including a single IHS rack) will benefit from the teachings of the present disclosure as well.

A plurality of IHSs are located in the IHS rack 202, including a plurality of storage IHSs 204, a plurality of server IHSs 206, and a plurality of switch IHSs 208. Any of the storage IHSs 204, server IHSs 206, and switch IHSs 208 may be the IHS 100 discussed above with reference to FIG. 1, and/or include some or all of the components of the IHS 100. One of skill in the art will recognize the conventional structures and functions of the storage IHSs 204, server IHSs 206, and switch IHSs 208, and thus those will not be discussed in detail. However, as discussed above, any or all of the storage IHSs 204, server IHSs 206, and switch IHSs 208 may include a cooling system according to the teachings of the present disclosure. In the illustrated embodiment, the switch IHSs 208 each include a plurality of ports 208a, along with a cooling system, discussed in detail below, that includes one or more fan systems 210 positioned adjacent the plurality of ports 208a. While the fan system(s) 210 are illustrated as positioned immediately adjacent the plurality of ports 208a in FIGS. 2a and 2b, one of skill in the art in possession of the present disclosure will recognize that the fan system(s) in the cooling system of the present disclosure may be located in different positions in an IHS to provide an airflow through the IHS to cool the IHS components while remaining within the scope of the present disclosure. The ports 208a on the switch IHSs 208 may be coupled through cabling 212 to other IHSs. In the illustrated embodiment, the ports 208a on one of the switch IHSs 208 are coupled through cabling 212a to one of the server IHSs 204, the ports on one of the switch IHSs 208 are coupled through cabling 212b to one of the server IHSs 206, and the ports 208a on both of the switch IHSs 208 are coupled to IHS that are not illustrated (e.g., IHSs in other IHS racks in the data center.)

FIG. 2a illustrates the switch IHSs 208 positioned in the IHS rack 202 in a "front mounted" orientation 214 in which the ports 208a are located adjacent the first/front side 202a of the IHS rack 202, while FIG. 2b illustrates the switch IHSs 208 positioned in the IHS rack 202 in a "rear mounted" orientation 126 in which the ports 208a are located adjacent the second/rear side 202b of the IHS rack 202. As discussed above, the first/front side 202a of the IHS rack 202 is generally considered to be the "cool" side of the IHS rack 202, while the second/rear side 202b of the IHS rack 202 is generally considered the "hot" side of the IHS rack 202, because the storage IHSs 204, server IHSs 206, and other conventional devices in the IHS rack 202 are typically configured to be mounted in the IHS rack 202 such that their cooling systems pull relatively cooler air from the first/front side 202a of the IHS rack 202 and expel that air, now heated air, out of the second/rear side 202b of the IHS rack 202. Thus, when conventional switch IHSs are positioned in the IHS rack 202 in the front mounted orientation 214, the cooling system in the switch IHSs may be configured to provide an airflow through those conventional switch IHSs in a direction that causes air to be drawn from the first/front/cool side 202a of the IHS rack 202 and expelled out to the second/rear/hot side 202b of the IHS rack 202. However, if those conventional switch IHSs are positioned in the IHS rack 202 in the rear mounted orientation 216, that cooling system may then provide an airflow through those conventional switch IHSs in a direction that causes air to be drawn from the second/rear/hot side 202b of the IHS rack 202 and expelled out to the first/front/cool side 202a of the IHS rack 202. As discussed above, the drawing of air from the second/rear/hot side 202b of the IHS rack 202 prevents the optimal cooling of conventional switch IHSs, and the expelling of that air out to the first/front/cool side 202a of the IHS rack 202 may result in that heated air being drawn into the storage IHSs 204 and server IHSs 206 (as well as into IHSs in adjacent IHS racks in the data center), thus reducing the cooling capabilities of any IHSs or other devices mounted in or adjacent to the IHS rack 202.

Figure 3:
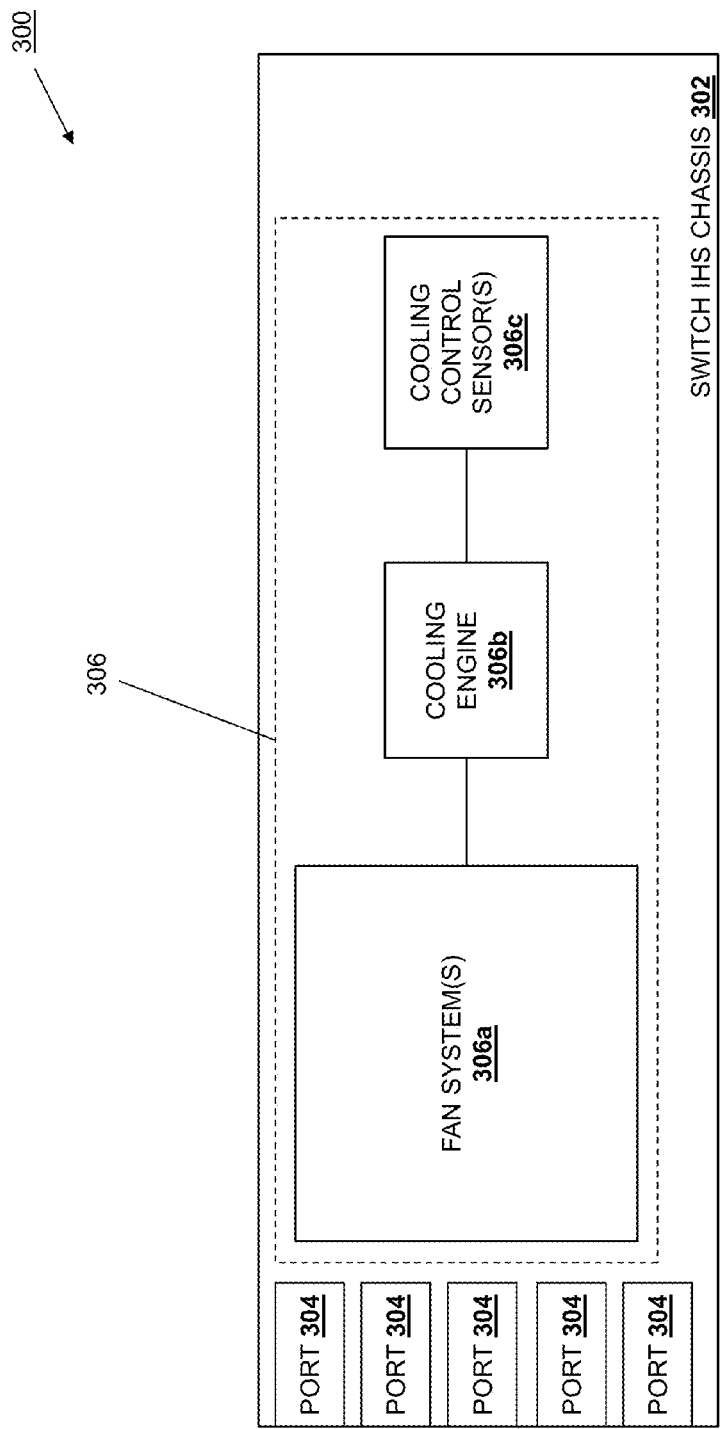
FIG. 3 is a schematic view illustrating an embodiment of an IHS with a cooling system that may be operated to provide airflow in an optimal direction in either of the orientations of FIGS. 2a and 2b

Referring now to FIG. 3, an embodiment of a switch IHS 300 is illustrated that may be, for example, either of the switch IHS 208 discussed above with reference to FIGS. 2a and 2b. The switch IHS 300 includes a switch IHS chassis 302 that houses the components of the switch IHS 300 and that may include features (not illustrated) that allow the switch IHS chassis 302 to couple to an IHS rack such as the IHS rack 202 of FIGS. 2a and 2b. A plurality of ports 304, which may be the plurality of ports 208a discussed above with reference to the switch IHSs 208 of FIGS. 2a and 2b, are located on the switch IHS chassis 302 and configured to couple to a variety of IHS known in the art (e.g., via the cabling 212 illustrated in FIGS. 2a and 2b). The switch IHS chassis 302 also includes a cooling system 306 that, in the illustrated embodiment, includes one or more fan systems 306a, a cooling engine 306b, and one or more cooling control sensors 306c. The fan system(s) 306a may include one or more contra-rotating fan systems, discussed in further detail below. In an embodiment, the switch IHS chassis 302 houses at least one processor (not illustrated, but similar to the processor 102 discussed above with reference to FIG. 1) that is coupled to a non-transitory, computer-readable medium (not illustrated, but similar to the storage device 108 and/or system memory 114 of FIG. 1) that includes instructions that, when executed by the at least one processor, cause the at least one processor to provide the cooling engine 306b that provides the functionality of the cooling engines discussed below. The one or more cooling control sensors 306c may include temperature sensors, mechanical switches, timers, and/or a variety of other sensors known in the art that are used in the cooling system 306 by the cooling engine 306b to determine how to operate the fan system 306a to provide an optimum direction of airflow through the switch IHS chassis 302, discussed in further detail below. The cooling engine 306b is coupled to the ports 304 (e.g., through connections between the ports 304 and the at least one processor that provides the cooling engine 306b), the fan system(s) 306a (e.g., through connections between the fans or fan controllers in the fan system(s) 306b and the at least one processor that provides the cooling engine 306b), the one or more cooling control sensors 306c (e.g., through connections between the cooling control sensor(s) 306c and the at least one processor that provides the cooling engine 306b), and/or to other components in the switch IHS chassis 302.

Figure 4A:
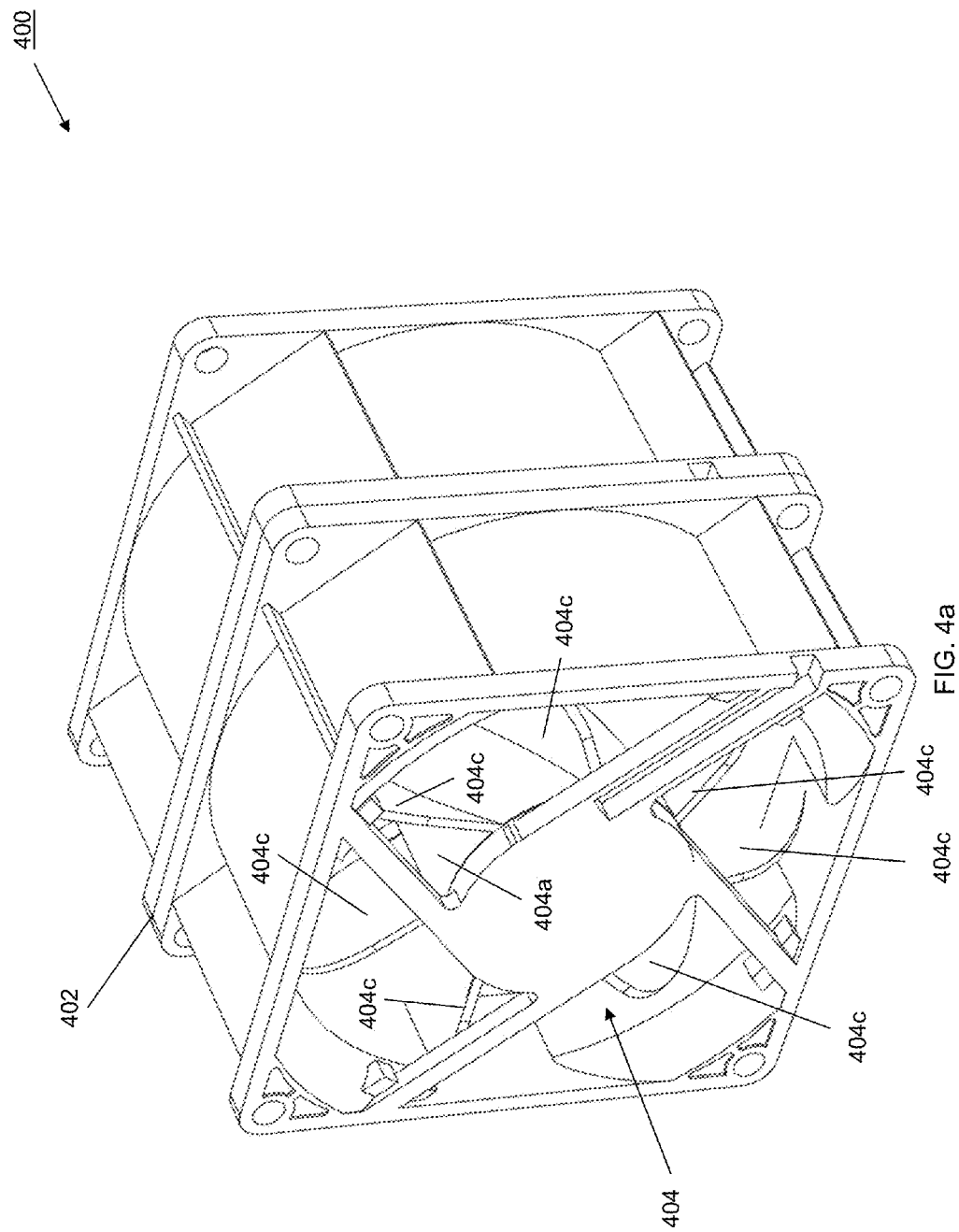
FIG. 4a is a perspective view illustrating an embodiment of a contra-rotating fan system used in the cooling system of FIG. 3.
Figure 4B:
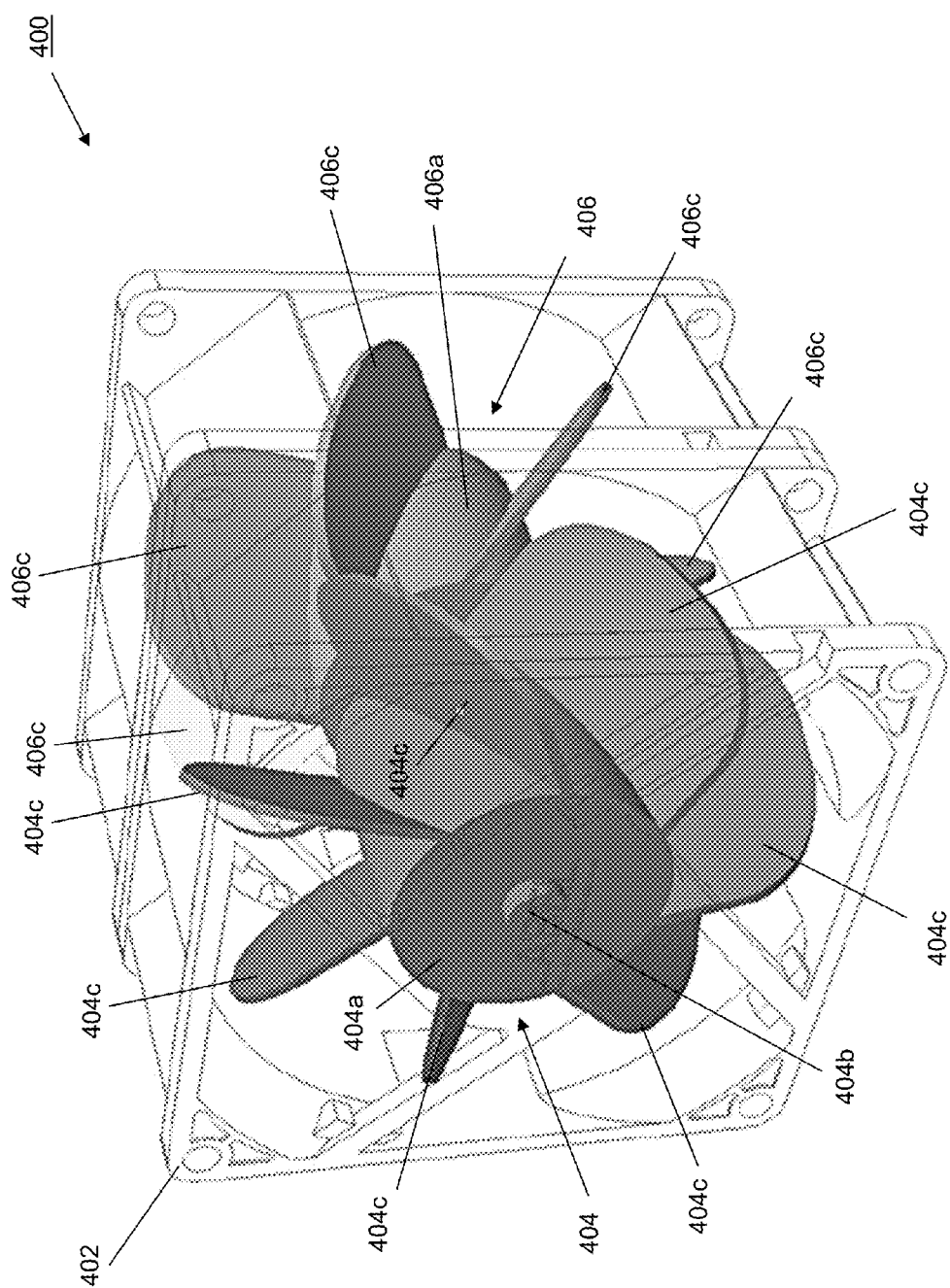
Figure 4D:
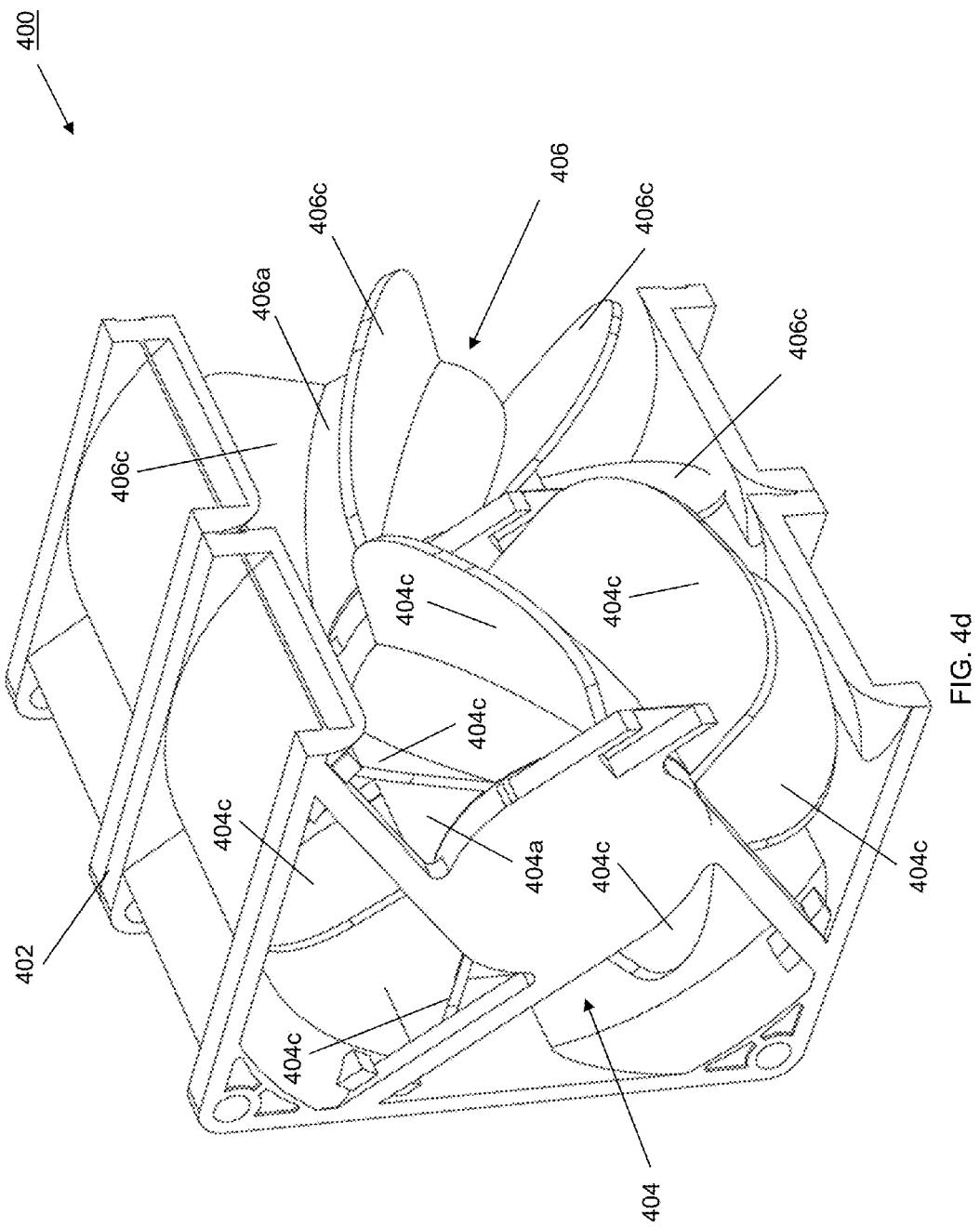
Figure 4E:
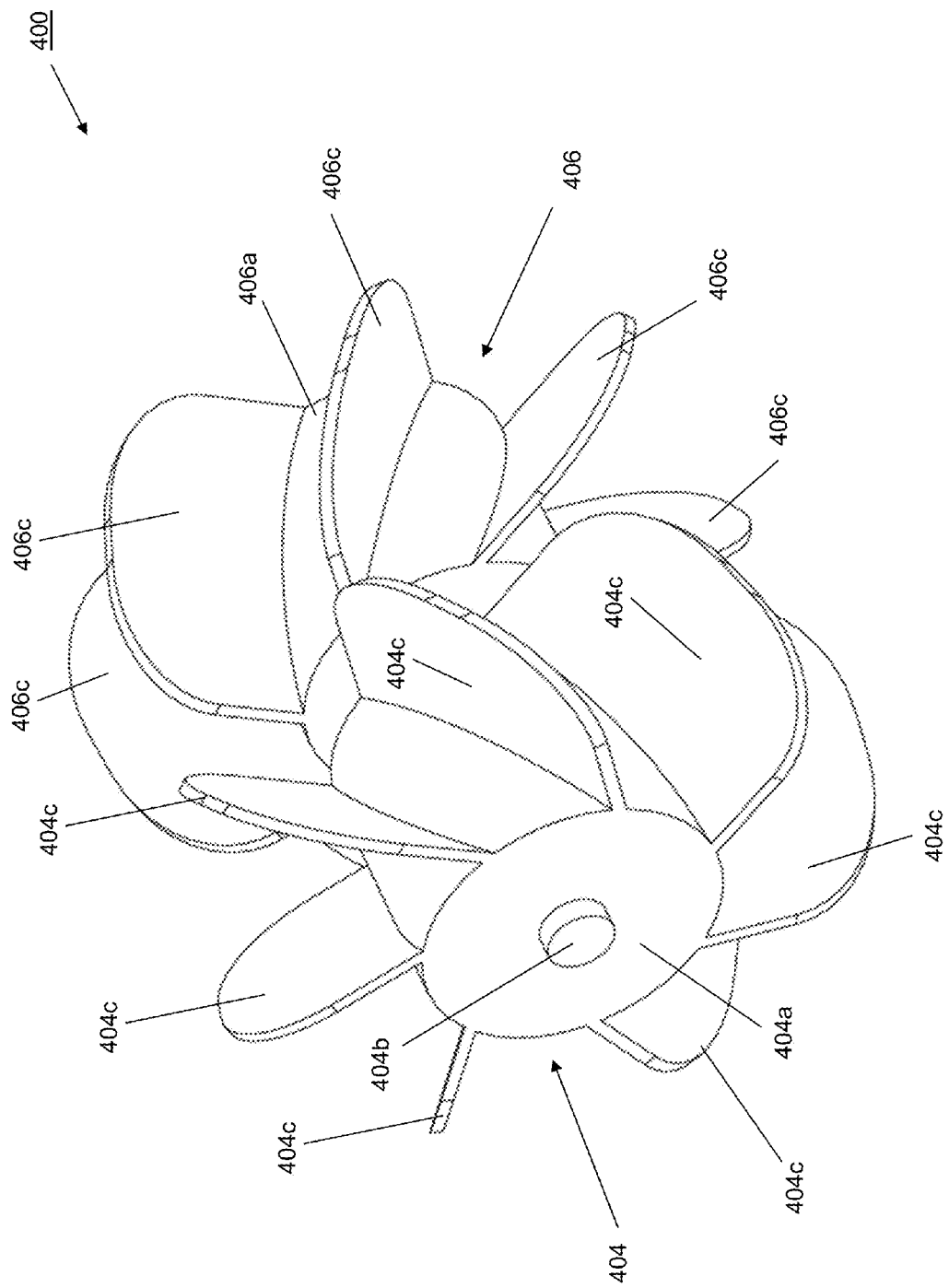

Referring now to FIGS. 4a, 4b, 4c, 4d, and 4e, an embodiment of a fan system 400 is illustrated that may be included in the one or more fan systems 210 or 306a of FIGS. 2a, 2b, and 3, respectively. In the illustrated embodiment, the fan system 400 is a contra-rotating fan system that includes a fan chassis 402 that houses a first fan 404 and a second fan 406 that is located axially adjacent the first fan 404. The first fan 404 includes a fan base 404a that is rotatably coupled to the fan chassis 402 by a rotational coupling 404b (illustrated in FIGS. 4b and 4e) that engages a rotational coupling 402a on the fan chassis 402 that may include a fan motor that is configured to rotate the first fan 404, discussed in further detail below. As such, at least one signal input (not illustrated) may be provided on the fan chassis 402, connected to the fan motor, and configured to receive one or more signals to operate the fan motor to rotate the first fan 404, as discussed below. The first fan 404 also includes a plurality of blades 404c that extend from the fan base 404a in an orientation that provides the airflows discussed below when the first fan 404 is rotated. In the illustrated embodiment, the first fan 404 includes seven of the blades 404c that are each positioned such that they form an obtuse angle A with the axis of rotation of the first fan 404 (e.g., that extends through the center of the fan base 404a through the rotational coupling 404b) when that angle is measured from the rotational coupling 404b (as illustrated in FIG. 4c). However, the number and orientation of the blades 404c extending from the fan base 404a may be selected based on a variety of system cooling considerations such as, for example, a desired airflow that addresses the cooling requirements of the system components, the maximum static pressure to overcome (e.g., based on an impedance resulting from the ports 208a/304 or other components positioned between the fan system 400 and the air source or otherwise obstructing airflow through the system), and/or a variety of other system cooling considerations. As such, a first fan having a different number of blades that are oriented differently on the fan base 404a from that illustrated and described herein are envisioned as falling within the scope of the present disclosure.

The second fan 406 includes a fan base 406a that is rotatably coupled to the fan chassis 402 by a rotational coupling 406b (illustrated in FIG. 4c) that engages a rotational coupling 402b on the fan chassis 402 that may include a fan motor that is configured to rotate the second fan 406, discussed in further detail below. As such, at least one signal input (not illustrated) may be provided on the fan chassis 402, connected to the fan motor, and configured to receive one or more signals to operate the fan motor to rotate the second fan 406, as discussed below. The second fan 406 also includes a plurality of blades 406c that extend from the fan base 406a in an orientation that provides the airflows discussed below when the second fan 406 is rotated. In the illustrated embodiment, the second fan 406 includes seven of the blades 406c that are each positioned such that they form an acute angle B with the axis of rotation of the second fan 406 (e.g., that extends through the center of the fan base 404a through the rotational coupling 404b) when that angle is measured from the rotational coupling 406b (as illustrated in FIG. 4c). However, the number and orientation of the blades 406c extending from the fan base 406a may be selected based on a variety of system cooling considerations such as, for example, a desired airflow that addresses the cooling requirements of the system components, the maximum static pressure to overcome (e.g., based on an impedance resulting from the ports 208a/304 or other components positioned between the fan system 400 and the air source or otherwise obstructing airflow through the system), and/or a variety of other system cooling considerations. As such, a second fan having a different number of blades that are oriented differently on the fan base 406a from that illustrated and described herein are envisioned as falling within the scope of the present disclosure.

In the illustrated embodiment, the first fan 404 and the second fan 406 include fan bases 404a and 406a, respectively, that are substantially the same size, along with blades 404c and 406c, respectively, that are the same in number (i.e., the first fan 404 and the second fan 406 each include seven blades 404c and 406c) and that are oriented such that the blades 404c and 406c are mirror images of each other when the first fan 404 and the second fan 406 are mounted to the fan chassis 402 and properly positioned. In other words, as illustrated in FIGS. 4b, 4c, 4d, and 4e, the first fan 404 and the second fan 406 may be rotationally positioned in the fan chassis 402 such that the blades 406c on the second fan 406 are a mirror image of the blades 404c on the first fan 404. In a specific embodiment, the features of the first fan 404 and the second fan 406 (e.g., size, number of blades, blade orientation, and/or a variety of other fan features known in the art) are selected such that each of the first fan 404 and the second fan 406 are configured to provide an airflow that is substantially similar to an airflow that would be provided by an equivalent second stage fan in a conventional contra-rotating fan system.

Conventional contra-rotating fan systems provide two axially adjacent fans that rotate in opposite directions and that are optimized to provide a system airflow in a single direction. In such conventional contra-rotating fan systems, a first stage "low pressure" fan includes low pressure fan features (e.g., size, number of blades, etc.) that are optimized to provide a low pressure fan airflow to a second stage "high pressure" fan that includes high pressure fan features (e.g., size, number of blades, etc.) that are different from the low pressure fan features and that allow the high pressure fan to receive the low pressure fan airflow from the low pressure fan and provide a high pressure fan airflow to create the system airflow. As is known in the art of conventional contra-rotating fans, the volume of air changes as its pressure increases, and the first and second stage fans may be separately optimized based on the pressure of their incoming air. Thus, the second stage/high pressure fan receives incoming air at a higher pressure than the first stage/low pressure fan, and thus will be optimized with different (high pressure) fan features than the low pressure fan features for the first stage/low pressure fan. For example, a conventional contra-rotating fan system typically includes fewer blades on the first stage/low pressure fan (e.g., 4 blades) than the second stage/high pressure fan (e.g., 5 blades).

However, it has been discovered that when a fan, which has been optimized to operate as a second stage high pressure fan in a conventional contra-rotating fan system, is rotated in a direction that is opposite to the direction of rotation for which that second state high pressure fan has been optimized, that second state high pressure fan produces an airflow that is substantially equivalent to the airflow that would be produced by a fan that was optimized to operate as a first stage low pressure fan for that conventional contra-rotating fan system. Conventionally, a fan that is optimized to produce an airflow in a single direction in response to being rotated in a "forward" direction (i.e., the direction of rotation that produces the optimized airflow) is not rotated in a "reverse" direction (i.e., a direction that is opposite the direction of rotation that produces the optimized airflow) because such reverse rotation causes that fan to operate inefficiently. However, the discovery detailed above allows a contra-rotating fan system to take advantage of such inefficiency by providing each of the two fans in the contra-rotating fan system such that they are both substantially equivalent to a second stage fan in a conventional contra-rotating fan system (e.g., a second stage fan with the same dimensions, number of blades, etc.) such that, when those two fans are rotated in opposite directions, the fan rotating in a reverse direction that it was not optimized for will produce an airflow that is substantially equivalent to the airflow that would be produced by a first stage fan in the conventional contra-rotating fan system.

Thus, in some embodiments, the features of the first fan 404 (e.g., size, number of blades, blade orientation, and/or a variety of other fan features known in the art) are selected such that the first fan 404 is configured to rotate in a first direction to provide an airflow that is substantially equivalent to an airflow that would be provided by a second stage fan in a conventional contra-rotating fan system, and is configured to rotate in a second direction that is opposite the first direction to provide an airflow that is substantially equivalent to an airflow that would be provided by a first stage fan in that conventional contra-rotating fan system. Similarly (using the first direction/second direction convention and conventional contra-rotating fan system discussed above with reference to the first fan 404), the features of the second fan 406 (e.g., size, number of blades, blade orientation, and/or a variety of other fan features known in the art) are selected such that the second fan 406 is configured to rotate in the second direction to provide an airflow that is substantially equivalent to the airflow that would be provided by the second stage fan in the conventional contra-rotating fan system, and is configured to rotate in the first direction to provide an airflow that is substantially equivalent to the airflow that would be provided by the first stage fan in that conventional contra-rotating fan system.

Figure 5:
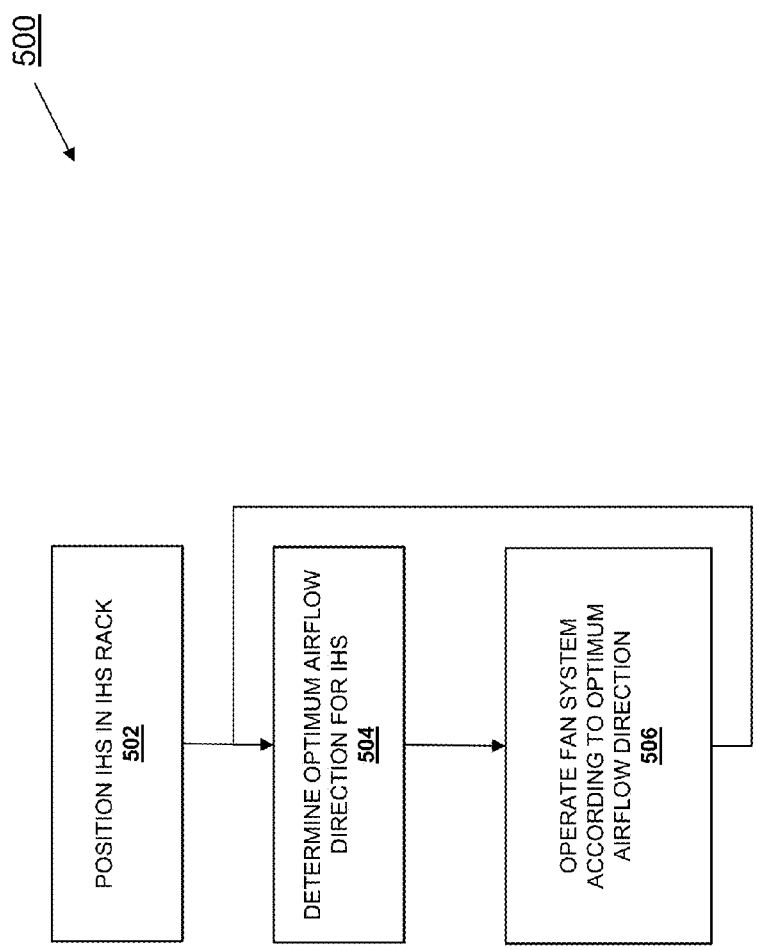
FIG. 5 is a flow chart illustrating an embodiment of a method for cooling an IHS.

Referring now to FIG. 5, an embodiment of a method 500 for providing cooling is illustrated. The method 500 begins at block 502 where an IHS is positioned in an IHS rack. In an embodiment, the switch IHS 208 may be positioned in the IHS rack 202 in the front mounted orientation 214, illustrated in FIG. 2a, or the rear mounted orientation 216, illustrated in FIG. 2b. As discussed above, the cooling system of the present disclosure may operate in non-rack scenarios (e.g., when a single IHS is located in a temperature varying situation that would benefit from the ability to automatically change the direction of airflow in the IHS to optimize cooling), and thus in some embodiments block 502 of the method 500 may be skipped.

The method 500 then proceeds to block 504 where an optimum airflow direction for the IHS is determined. In an embodiment, at block 504, the cooling engine 306b determines an optimum airflow direction for the switch IHS 208/300. In several embodiments, the cooling engine 306b communicates with the one or more cooling control sensors 306c to determine the optimum airflow direction for the switch IHS 208/300. In an embodiment, the one or more cooling control sensors 306c may include a mechanical switch that is accessible on an outer surface of the switch IHS chassis 302 and that is actuated at block 504 to provide a signal to the cooling engine 306b that indicates the optimum airflow direction for the switch IHS 208/300. For example, at block 504, the mechanical switch may be actuated by a user based on the orientation of the switch IHS 208/300 in the IHS rack 202 (e.g., the mechanical switch may allow the user to switch between "front mounted" and "rear mounted".) In another example, at block 504, the mechanical switch may be actuated by the IHS rack 202 depending on the orientation of the switch IHS 208/300 in the IHS rack 202 (e.g., the IHS rack 202 may include a mechanical switch actuator that actuates the mechanical switch to a "front mounted" setting when the switch IHS chassis 302 is positioned in the IHS rack 202 in the front mounted orientation 214, and actuates the mechanical switch to a "rear mounted" setting when the switch IHS chassis 302 is positioned in the IHS rack 202 in the rear mounted orientation 216) such that no user action is required in the determination of the optimum airflow direction at block 504.

In an embodiment, the one or more cooling control sensors 306c may include one or more temperature sensors (e.g., a single internal temperature sensor, temperature sensors at the "front" and "rear" of the switch IHS chassis 302, etc.) accessed by the cooling engine 306b at block 504 to determine the optimum airflow direction for the switch IHS 208/300. For example, at block 504, the one or more temperature sensors may be used by the cooling engine 306b to determine the locations of the "hot" and "cool" sides of the IHS rack 202, discussed above. As discussed above, when IHSs 204, 206, and 208 in the IHS rack 202 are operating, the first/front side 202a of the IHS rack 202 will typically include cooler air than the second/rear side 202b of the IHS rack 202 due to the IHS rack mounting conventions for the IHSs and the IHS cooling systems being configured to draw their cooling air from the first/front side 202a of the IHS rack 202 and expel heated air to the second/rear side 202b of the IHS rack 202. At block 504, the cooling engine 306b may operate to determine a first side temperature detected by a temperature sensor on a "front" side of the switch IHS chassis 302 and a second side temperature detected by a temperature sensor on a "rear" side of the switch IHS chassis 302, and determine that the optimum airflow direction for the switch IHS 300 is an airflow from the cooler air side (as determined by the relatively lower detected temperature) to the hotter air side (as determined by the relatively higher detected temperature). In some embodiments, a single temperature sensor may be utilized at block 504 by operating the fan system 306a to produce a first airflow and determining a temperature detected by the single temperature sensor, then reversing the operation of the fan system 306a, discussed below, to produce a second airflow that is opposite the first airflow and determining a temperature detected by the single temperature sensor, and then determining that the optimum airflow direction for the switch IHS 300 is the one that provided the airflow that resulted in the relatively lower detected temperature.

As discussed below, the temperature sensor(s) may be continuously or periodically monitored, and the fan system operated to produce an airflow, that results in air being drawn into the switch IHS chassis 302 from a side that is adjacent relatively cooler air, and expelled out of the switch IHS chassis 302 to a side that is adjacent relatively hotter air. Such embodiments provide for optimum airflow direction determination in situations such as, for example, when a data center is powered up and the air on both sides of the switch IHS chassis 302 is initially at the same temperature. In such a situation, the cooling system 306 may be operated in a default mode that draws air from the front side of the switch IHS chassis 302 and expels that air to the rear side of the switch IHS chassis 302. However, with the continuous or periodic monitoring of the temperature as discussed above, the operation of the IHSs in the IHS rack 202 to produce relatively hotter air on one side of the switch IHS chassis 302 will result in the detection of that temperature differential and the determination of the optimum airflow direction that will draw air from the relatively cooler side of the switch IHS chassis 302. Furthermore, even in non-IHS rack situations, changing air temperature situations may be detected and the airflow in the switch IHS chassis 302 optimized automatically. In some embodiment, the cooling engine 306b may include an override that may be actuated by a user to set the airflow direction (e.g., "front-to-back", "back-to-front", "default"). While a few examples have been provided, one of skill in the art in possession of the present disclosure will recognize that the determination of the optimum airflow direction for the IHS may be made in a variety of manners while remaining within the scope of the present disclosure. For example, a user may provide a schedule to the cooling engine 306a that provides the airflow direction for the switch IHS chassis 302 at different times, and the cooling control sensors 306c may be timers that are used by the cooling engine 306b along with the schedule to determine the optimum airflow direction at block 504.

The method 500 then proceeds to block 506 where the fan system is operated according to the optimum airflow direction. In an embodiment, the cooling engine 306b sends a signal to the fan system 306a that is based upon the optimum airflow direction determined at block 504 and that causes the fan system 306a to operate to produce an airflow in the optimum airflow direction.

In an embodiment, the first fan 404 and the second fan 406 may include fan motors (e.g., 12 volt direct current (DC) brushless motors) with a wire harness that includes conventional power, return, tachometer output, and pulse width modulation (PWM) input wires. In addition, that wire harness may include a new signal input wire for rotation direction reversal that, in response to receiving a logic level voltage (e.g., from the cooling engine 306b), causes the fan motor level drive circuitry to invert the motor coil firing direction and operate that fan in a reverse direction. In an embodiment, the first fan 404 and the second fan 406 may include three phase fan motors. In other embodiments, the fan motor phases may be driven by the cooling engine 306b or other system processor. For example, three phase drivers may be coupled to the cooling engine 306b to drive the three windings directly, and the reversal of the direction of the first fan 404 and the second fan 406 may be performed by inverted the phase firing order.

Referring now to the specific example illustrated in FIG. 2a, and with reference to FIGS. 4a-e, the switch IHS 208/300 may be positioned in the IHS rack 202 in the front mounted orientation 214, and the contra-rotating fan system 400 may be positioned in the switch IHS chassis 300 such the first fan 404 is located between the ports 208a/304 and the second fan 406. As discussed above with reference to blocks 502 and 504, in the front mounted orientation 214, the cooling engine 306b may operate to determine an optimum airflow direction that causes the fan system(s) 306a in the switch IHS 208/300 to draw air from the first/front side 202a of the IHS rack 202 and expel that air to the second/rear side 202b of the IHS rack 202, which requires that the first fan 404 and the second fan 406 be rotated (in opposite directions) to produce an airflow that draws air in through the ports 208a/304.

Figure 6A:
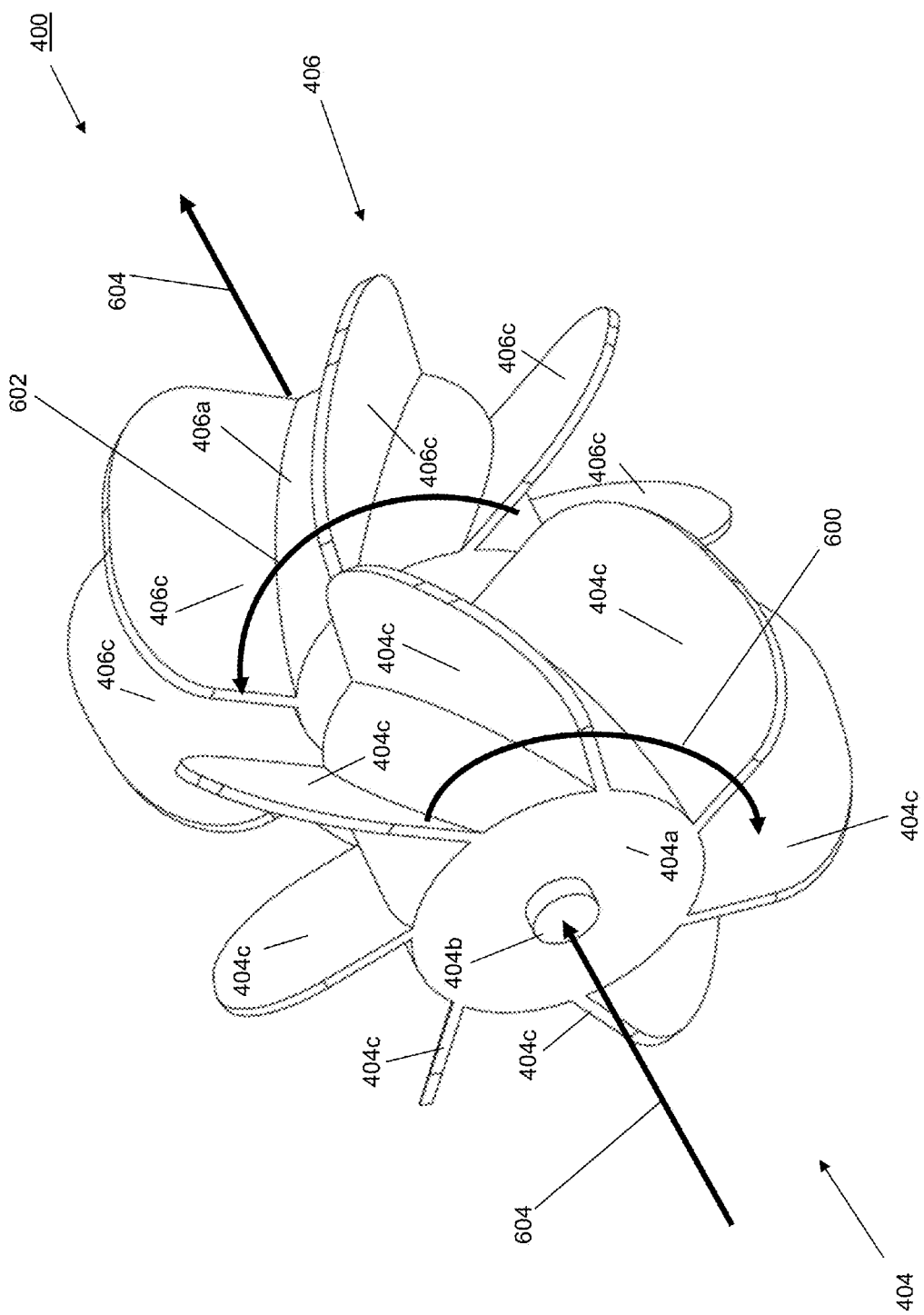
FIG. 6a is a perspective view illustrating an embodiment of contra-rotating fans in the contra-rotating fan system of FIGS. 4a-e operating according to a first rotation scheme to produce an airflow in a first direction.

Referring to FIG. 6a, at block 506 the cooling engine 306b sends a signal to the fan system 400 that causes the first fan 404 to rotate in a first direction 600 and the second fan 406 to rotate in a second direction 602 that is opposite the first direction 600, and the rotation of both the first fan 404 and the second fan 406 produces a system airflow in a third direction 604. As discussed above, and the second fan 406 has been optimized to rotate in the second direction 602 to produce a portion of the system airflow in the third direction 604 that is substantially similar to the airflow that would be produced by an equivalent second stage fan in a conventional contra-rotating fan system, while the first fan 404 has been optimized to rotate in the second direction 602 to produce a portion of the system airflow in a fourth direction 606 (illustrated in FIG. 6b) that is opposite the third direction 604 and that is substantially similar to the airflow that would be provided by an equivalent second stage fan in a conventional contra-rotating fan system. However, as also discussed above, the rotation of the first fan 404 in the first direction 600 produces a portion of the system airflow in the third direction 604 that is substantially similar to a first stage fan in a conventional contra-rotating fan system that includes a second stage fan that is equivalent to the second fan 406. In other words, the rotation of the first fan 404 in the first direction 600 (its non-optimized direction) produces the equivalent of a first stage/low pressure fan airflow in a conventional contra-rotating fan system, and the rotation of the second fan 406 in the second direction 602 (its optimized direction) produces the equivalent of a second stage/high pressure fan airflow in a conventional contra-rotating fan system, with the first stage/low pressure fan airflow being lower than the second stage/high pressure fan airflow. Thus, the cooling system 306 operates to draw air from the first/front side 202a of the IHS rack 202 (e.g., through the ports 208a/304) and expel air to the second/rear side 202b of the IHS rack 202 when the switch IHS 208 is in the front mounted orientation 214.

Referring now to the specific example illustrated in FIG. 2b, and with reference to FIGS. 4a-e, the switch IHS 208/300 may be positioned in the IHS rack 202 in the rear mounted orientation 216, and the contra-rotating fan system 400 may be positioned in the switch IHS chassis 300 identically as discussed above with reference to FIG. 6a such the first fan 404 is located between the ports 208a/304 and the second fan 406. As discussed above with reference to blocks 502 and 504, in the rear mounted orientation 216, the cooling engine 306b may operate to determine an optimum airflow direction that causes the fan system(s) 306a in the switch IHS 208/300 to draw air from the first/front side 202a of the IHS rack 202 and expel that air to the second/rear side 202b of the IHS rack 202, which requires that the first fan 404 and the second fan 406 be rotated (in opposite directions) to produce an airflow that expels air out through the ports 208a/304.

Figure 6B:
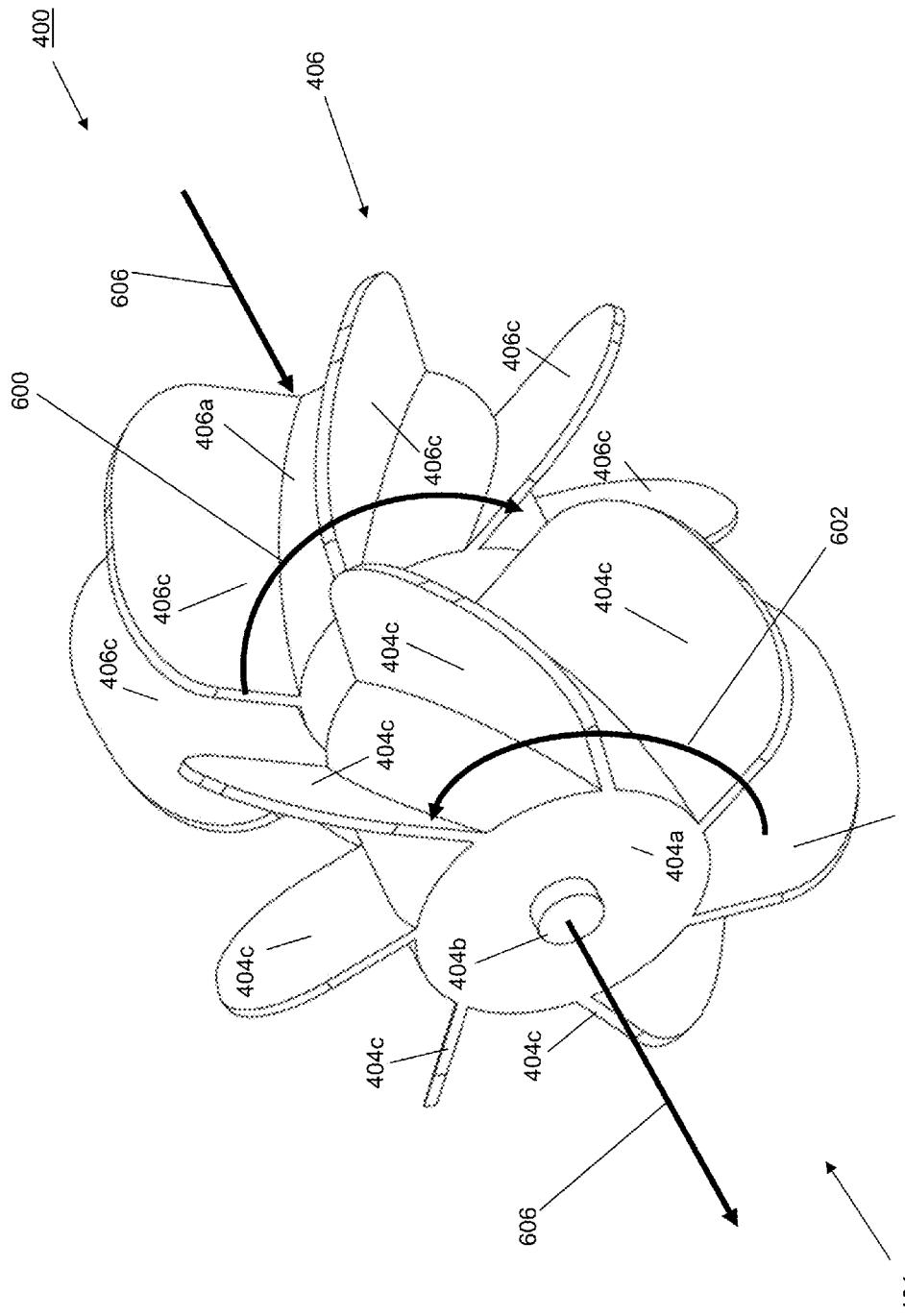

Referring to FIG. 6b, at block 506 the cooling engine 306b sends a signal to the fan system 400 that causes the first fan 404 to rotate in the second direction 602 and the second fan 406 to rotate in a first direction 600 that is opposite the second direction 602, and the rotation of both the first fan 404 and the second fan 406 produces a system airflow in a fourth direction 606 that is opposite the third direction 604 illustrated in FIG. 6a. As discussed above, and the first fan 406 has been optimized to rotate in the second direction 602 to produce a portion of the system airflow in the fourth direction 606 that is substantially similar to the airflow that would be produced by an equivalent second stage fan in a conventional contra-rotating fan system, while the second fan 406 has been optimized to rotate in the second direction 602 to produce a portion of the system airflow in the third direction 604 (illustrated in FIG. 6a) that is opposite the fourth direction 606 and that is substantially similar to the airflow that would be provided by an equivalent second stage fan in a conventional contra-rotating fan system. However, as also discussed above, the rotation of the second fan 406 in the first direction 600 produces a portion of the system airflow in the fourth direction 606 that is substantially similar to a first stage fan in a conventional contra-rotating fan system that includes a second stage fan that is equivalent to the first fan 404. In other words, the rotation of the second fan 406 in the first direction 600 (its non-optimized direction) produces the equivalent of a first stage/low pressure fan airflow in a conventional contra-rotating fan system, and the rotation of the first fan 406 in the second direction 602 (its optimized direction) produces the equivalent of a second stage/high pressure fan airflow in a conventional contra-rotating fan system, with the first stage/low pressure fan airflow being lower than the second stage/high pressure fan airflow. Thus, the cooling system 306 operates to draw air from the first/front side 202a of the IHS rack 202 and expel air to the second/rear side 202b of the IHS rack 202 (e.g., through the ports 208a/304) when the switch IHS 208 is in the front mounted orientation 214.

The method 500 may then return to blocks 504 and 506 to continuously or periodically determine the optimum airflow direction for the IHS and operate the fan system according to that optimum airflow direction. Thus, systems and methods have been described that provide for changing the direction of airflow in an IHS chassis by reversing the direction of rotation of fans in a contra-rotating fan system. Many embodiments of the systems and methods provide for automatic determination of the optimum direction of airflow in the IHS chassis (and relative to the IHS chassis) such that air is drawn from a cooler air source and expelled to a hotter air destination regardless of which of a plurality of orientations the IHS is positioned in. The provision of such a reversible, contra-rotating fan system provides benefits such as the ability to overcome relatively high airflow impedances (e.g., resulting from the increasingly high number and close spacing of ports and components within IHSs), the prevention of air backflow through the IHS in the event one of the fans in the contra-rotating fan system fails, and/or a variety of other contra-rotating fan system benefits. The ability to quickly and, in many embodiments, automatically, reverse the direction of rotation of the contra-rotating fans may operate to ensure that IHS cooling systems are always configured to produce the proper airflow such that the life of IHS components in the IHS are not reduced, and that other adjacent IHSs are not improperly cooled.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A contra-rotating fan system, comprising:
   a fan chassis;
   a first fan that is mounted in the fan chassis and that includes: a first motor, at least one signal input that is coupled to the first motor and that is configured to receive one or more signals from a cooling engine, and a number of blades that are oriented to:
      provide an airflow in a first direction in response to the cooling engine receiving a first signal from a cooling control sensor that causes the first motor to rotate the first fan in a second direction; and
      provide an airflow in a third direction that is opposite the first direction in response to the cooling engine receiving a second signal from the cooling control sensor that causes the first motor to rotate the first fan in a fourth direction that is opposite the second direction; and
   a second fan that is mounted in the fan chassis adjacent the first fan and that includes: a second motor, at least one signal input that is coupled to the second motor and that is configured to receive the one or more signals from the cooling engine, and the same number of blades as the first fan, wherein the first motor and the second motor are configured to rotate the first fan and the second fan at the same time in opposite directions, and wherein the blades on the second fan are oriented to:
      provide an airflow in the first direction in response to the cooling engine receiving the first signal from the cooling control sensor that causes the second motor to rotate the second fan in the fourth direction; and
      provide an airflow in the third direction in response to the cooling engine receiving the second signal from the cooling control sensor that causes the second motor to rotate the second fan in the second direction.

2. The contra-rotating fan system of claim 1, wherein the rotation of the first fan in the second direction provides a first airflow in the first direction and the rotation of the first fan in the fourth direction provides a second airflow in the third direction, and wherein the second airflow is less than the first airflow.

3. The contra-rotating fan system of claim 2, wherein the rotation of the second fan in the fourth direction provides a third airflow in the first direction and the rotation of the second fan in the second direction provides a fourth airflow in the third direction, and wherein the third airflow is less than the fourth airflow.

4. The contra-rotating fan system of claim 3, wherein the first airflow provided by the first fan and the fourth airflow provided by the second fan are equivalent to an airflow provided by a second stage fan in a conventional contra-rotating fan system that has the same number of blades and the same dimensions as the first fan and the second fan.

5. The contra-rotating fan system of claim 4, wherein the second airflow provided by the first fan and the third airflow provided by the second fan are each equivalent to an airflow provided by a first stage fan in the conventional contra-rotating fan system that includes the second stage fan.

6. The contra-rotating fan system of claim 1, wherein the orientation of the blades on the second fan and the mounting of the second fan in the fan chassis adjacent the first fan allows for the second fan to be rotationally positioned such that the blades on the second fan are a mirror image of the blades on the first fan.

7. The contra-rotating fan system of claim 1, wherein the cooling control sensor includes:
   a first temperature sensor that is spaced apart from the fan chassis in the first direction; and
   a second temperature sensor that is spaced apart from the fan chassis in the third direction,
   wherein the first signal is generated by the cooling control sensor when the second temperature sensor measures a lower temperature than the first temperature sensor, and
   wherein the second signal is generated by the cooling control sensor when the first temperature sensor measures a lower temperature than the second temperature sensor.

8. An information handling system (IHS), comprising:
   a chassis;
   at least one processor that is in the IHS chassis;
   a non-transitory memory system that is located in the chassis and that includes instructions that, when executed by the at least one processor, cause the at least one processor to provide a cooling engine; and
   a cooling system that is located in the chassis and that is coupled to the at least one processor, wherein the cooling system comprises:
      a first fan that includes: a first motor, at least one signal input that is coupled to the first motor and that is configured to receive one or more signals from the cooling engine, and a number of blades that are oriented to:
         provide an airflow in a first direction through the chassis when the cooling engine receives a first signal from a cooling control sensor and, response, causes the first motor to rotate the first fan in a second direction; and
         provide an airflow in a third direction through the chassis that is opposite the first direction when the cooling engine receives a second signal from the cooling control sensor and, in response, causes the first motor to rotate the first fan in a fourth direction that is opposite the second direction; and
      a second fan that is positioned adjacent the first fan and that includes: a second motor, at least one signal input that is coupled to the second motor and that is configured to receive one or more signals from the cooling engine, and the same number of blades as the first fan, wherein the first motor and the second motor are configured to rotate the first fan and the second fan at the same time in opposite directions, and wherein the blades on the second fan are oriented to:
         provide an airflow in the first direction through the chassis when the cooling engine receives the first signal from the cooling control sensor and, in response, causes the second motor to rotate the second fan in the fourth direction; and provide an airflow in the third direction through the IHS chassis when the cooling engine receives the second signal from the cooling control sensor and, in response, causes the second motor to rotate the second fan in the second direction.

9. The IHS of claim 8, wherein the rotation of the first fan in the second direction provides a first airflow in the first direction through the chassis and the rotation of the first fan in the fourth direction provides a second airflow in the third direction through the chassis, and wherein the second airflow is less than the first airflow.

10. The IHS of claim 9, wherein the rotation of the second fan in the fourth direction provides a third airflow in the first direction through the chassis and the rotation of the second fan in the second direction provides a fourth airflow in the third direction through the chassis, and wherein the third airflow is less than the fourth airflow.

11. The IHS of claim 10, wherein the first airflow provided by the first fan and the fourth airflow provided by the second fan are equivalent to an airflow provided by a second stage fan in a conventional contra-rotating fan system that has the same number of blades and the same dimensions as the first fan and the second fan.

12. The IHS of claim 11, wherein the second airflow provided by the first fan and the third airflow provided by the second fan are each equivalent to an airflow provided by a first stage fan in the conventional contra-rotating fan system that includes the second stage fan.

13. The IHS of claim 8, wherein the orientation of the blades on the second fan and the positioning of the second fan adjacent the first fan allows for the second fan to be rotationally positioned such that the blades on the second fan are a mirror image of the blades on the first fan.

14. The IHS of claim 8, wherein the cooling control sensor includes:
a first temperature sensor that is spaced apart from the fan chassis in the first direction; and
a second temperature sensor that is spaced apart from the fan chassis in the third direction,
wherein the first signal is generated by the cooling control sensor when the second temperature sensor measures a lower temperature than the first temperature sensor, and
wherein the second signal is generated by the cooling control sensor when the first temperature sensor measures a lower temperature than the second temperature sensor.

15. A method for providing cooling, comprising:
operating a system having a first fan that includes: a first motor, at least one signal input that is coupled to the first motor and that is configured to receive one or more signals from a cooling engine, and a number of blades, and a second fan that is positioned adjacent the first fan and that includes: a second motor, at least one signal input that is coupled to the second motor and that is configured to receive the one or more signals from the cooling engine, and the same number of blades as the first fan;

providing an airflow in a first direction in response to the cooling engine receiving a first signal from a cooling control sensor that causes: the first motor to rotate the first fan in a second direction, and the second motor to rotate the second fan in a third direction that is opposite the second direction at the same time as the first fan rotates in the second direction; and providing airflow in a fourth direction that is opposite the first direction in response to the cooling engine receiving a second signal from the cooling control sensor that causes: the first motor to rotate the first fan in the third direction, and the second motor to rotate the second fan in the second direction at the same time as the first fan rotates in the third direction.

16. The method of claim 15, wherein the rotation of the first fan in the second direction provides a first portion of the airflow in the first direction and the rotation of the first fan in the third direction provides a second portion of the airflow in the fourth direction, and wherein the second portion of the airflow in the fourth direction is less than the first portion of the airflow in the first direction.

17. The method of claim 16, wherein the rotation of the second fan in the third direction provides a second portion of the airflow in the first direction and the rotation of the second fan in the second direction provides a first portion of the airflow in the fourth direction, and wherein the second portion of the airflow in the first direction is less than the first portion of the airflow in the fourth direction.

18. The method of claim 17, wherein the first portion of the airflow in the first direction provided by the first fan and the first portion of the airflow in the fourth direction provided by the second fan are equivalent to an airflow provided by a second stage fan in a conventional contra-rotating fan system that has the same number of blades and the same dimensions as the first fan and the second fan, and wherein the second portion of the airflow in the fourth direction provided by the first fan and the second portion of the airflow in the first direction provided by the second fan a are each equivalent to an airflow provided by a first stage fan in the conventional contra-rotating fan system that includes the second stage fan.

19. The method of claim 15, wherein the orientation of the blades on the second fan and the positioning of the second fan adjacent the first fan allows for the second fan to be rotationally positioned such that the blades on the second fan are a mirror image of the blades on the first fan.

20. The method of claim 15, wherein cooling control sensor includes:
a first temperature sensor that is spaced apart from the fan chassis in the first direction; and
a second temperature sensor that is spaced apart from the fan chassis in the third direction,
wherein the first signal is generated by the cooling control sensor when the second temperature sensor measures a lower temperature than the first temperature sensor, and
wherein the second signal is generated by the cooling control sensor when the first temperature sensor measures a lower temperature than the second temperature sensor.

* * * * *